United States Patent [19]

Tong et al.

[11] Patent Number: 5,915,193
[45] Date of Patent: *Jun. 22, 1999

[54] METHOD FOR THE CLEANING AND DIRECT BONDING OF SOLIDS

[76] Inventors: Qin-Yi Tong, Apt. A, 804 Louise Cir.; Ulrich Goesele, 5 Learned Pl., both of Durham, N.C. 27705; Ling Tong, Rm. 3225 NGC The graduate college, Princeton, N.J. 08544

[ * ] Notice: This patent is subject to a terminal disclaimer.

[21] Appl. No.: 08/444,035

[22] Filed: May 18, 1995

[51] Int. Cl.[6] .................................................. H01L 21/304
[52] U.S. Cl. ............................ 438/455; 438/406; 228/206
[58] Field of Search ...................................... 438/406, 455, 438/DIG. 12, 974; 156/153, 154, 281, 306.3; 228/116, 903, 206, 211; 134/3

[56] References Cited

U.S. PATENT DOCUMENTS 3,713,206  1/1973  Galmiche et al. .
4,883,215  11/1989  Goesele et al. ......................... 228/116
5,494,856  2/1996  Beaumont et al. .

OTHER PUBLICATIONS

K. Mitani et al., "Causes and Prevention of Temp.–Dependent Bubbles in Silicon Wafer Bonding", Jpn. Journal of Applied Physics, vol. 30 (1991) 615–622.
W. Kern and D.A. Puotinen, "Cleaning Solutions Based on Hydrogen Peroxide for use in Silicon Semicond. Tech." RCA Review vol. 31 (1970) 186–206.
T. Takahagi et al. "The formation of hydrogen passivated silicon single–crystal surfaces using ultraviolet cleaning and HF etching", J. Applied Physics vol. 64 (1988) 3516–3521.

Primary Examiner—John F. Niebling
Assistant Examiner—S. Mulpuri

[57] ABSTRACT

Cleaning in periodic acid ($H_5IO_6$) aqueous solutions (HI solutions) of particular compositions removes thermally unstable hydrocarbons from the surfaces of semiconductor wafers and enables the direct bonding of semiconductor surfaces such that the bonded interface between these surfaces remains free of bubbles even after heating subsequent to bonding.

7 Claims, 1 Drawing Sheet

1

METHOD FOR THE CLEANING AND DIRECT BONDING OF SOLIDS

BACKGROUND OF THE INVENTION

Wafer bonding has been developed as a method for bonding large area oxidized or non-oxidized silicon wafers as disclosed by U. Goesele and R. Stengl in U.S. Pat. No. 4,883,215, Entitled "Method for Bubble-Free Bonding of Silicon Wafers". Since wafer bonding makes it possible to bury oxide and implantation layers within the bulk of a monocrystalline silicon wafer and combine monocrystalline silicon wafers, it may be a low cost and highly flexible method for silicon-on-insulator (SOI) and epitaxial applications. Silicon direct bonding (SDB) may also lead to new device structures in the fields of power devices and sensors.

However, in spite of its apparent simplicity there is at least one major obstacle to overcome before wafer bonding can be considered as a reliable technique to produce SOI wafers for electronic devices or for other possible applications. The obstacle is bonding voids or "bubbles" which form at the interface of the mated wafers and are detrimental to the efficacy of the bond. Goesele and Stengl developed a novel and simple procedure relating to this obstacle which serves to eliminate interface bubbles at the mated wafer interface and which does not mandate that the procedure be performed in a Cleanroom.

Interface bubbles in bonded wafers formed by the direct bonding method disclosed by Goesele and Stengl are thought to be caused by dust or other particles and insufficient wafer flatness. While the latter case can be excluded by appropriate wafer specifications, it is difficult to realize totally particle-free wafer surfaces prior to the bonding procedure. It has been found that, even for wafers mated in a Class 1 Cleanroom, unless extreme care has been taken in terms of keeping the time between cleaning and bonding short, almost all of the wafers contain one or more bubbles due to enclosed particles of less than 1 micrometer ($\mu$m) in size. Although the complete absence of bubbles may not be necessary for manufacturing power devices from bonded wafers, it is necessary for SOI applications and desirable for all applications. In order to produce completely void-free wafer pairs more complicated techniques rely on high pressure and annealing techniques after wafer bonding and, contrary to findings of some researchers in this field, applicant has not found that the bubbles vanish when wafer pairs are annealed above 1000° C. Centigrade (C). Instead, it was found that basically all the voids introduced during the bonding process at room temperature remain during the annealing step. The procedure developed by Goesele and Stengl as well as other methods based on the careful use of Cleanrooms allow nowadays the preparation of bonded silicon wafer pairs with no bubbles present at the bonding interface directly after room temperature bonding. It has now been discovered, however, that in such initially bubble-free bonded wafers, bubbles are found to form at the bonding interface after this bonded interface is heated to elevated temperatures, as reported by Mitani, Lehmann, Stengl, Feijoo, Goesele and Massoud in the Japanese Journal of Applied Physics in 1991, volume 30 starting on page 615. These interfacial bubbles are thought to be caused by thermally unstable hydrocarbons (denoted here by $CH_x$) which desorb from the silicon surfaces during a heat treatment and develop a sufficiently high gas pressure to generate bubbles at the interface of the bonded silicon wafers.

OBJECTS OF THE INVENTION

It is an object of the invention to avoid bubble formation at the interface of bonded silicon wafers when these bonded wafers are heated to elevated temperatures subsequent to the bonding process.

It is a further object of the invention to provide a cleaning method and composition for the thorough removal of thermally unstable hydrocarbons from semiconductor surfaces that avoids the formation of bubbles at the interface when these bonded wafers are heated to elevated temperatures subsequent to the bonding process.

It is still a further object of the invention to provide the said cleaning method and composition which may use low temperatures typically no higher than 100° C.

It is still a further object of the invention to provide the said cleaning method and composition which is hazard-free and environmentally benign.

DESCRIPTION OF THE INVENTION

Figure 1:
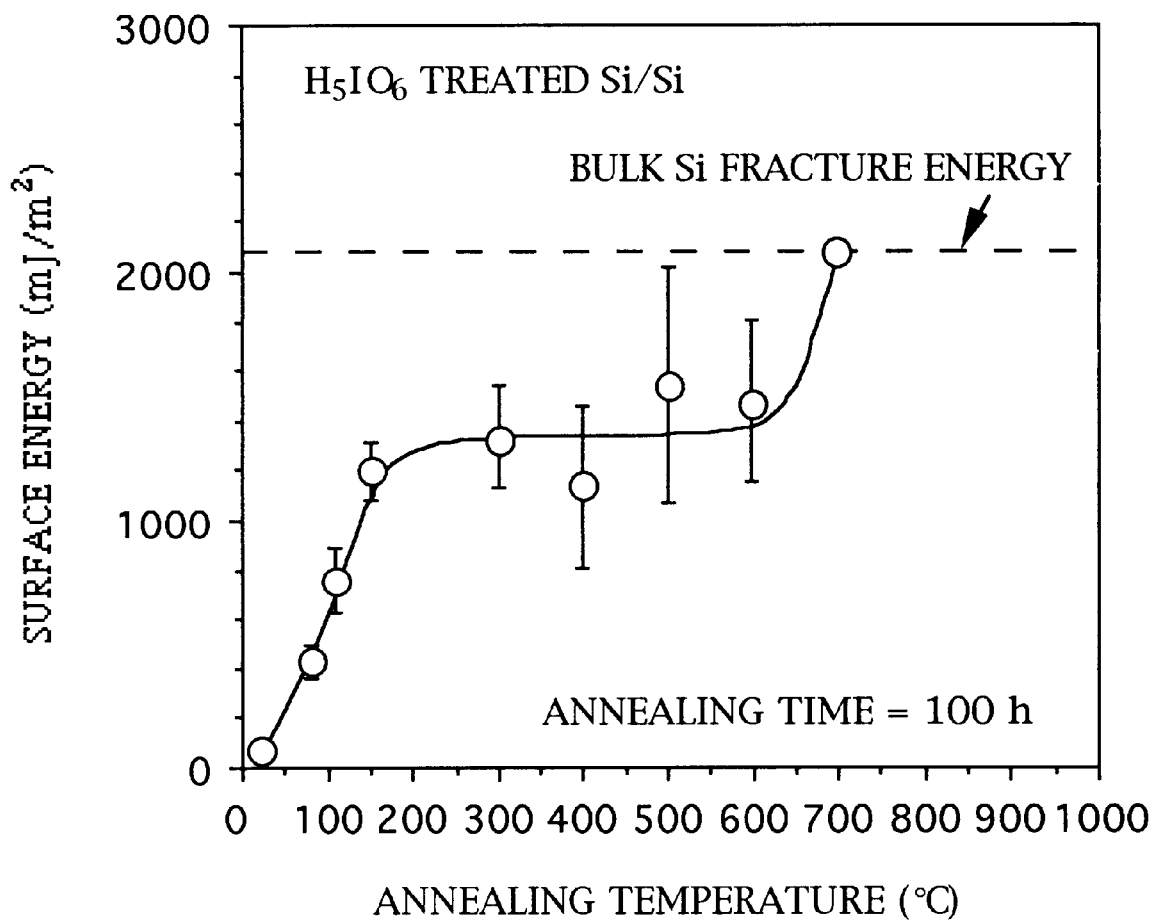
FIG. 1 Surface energy of bonded periodine treated silicon wafers as a function of annealing temperature.

To prevent bubble formation in bonded hydrophilic silicon/silicon wafer pairs, two main approaches have been reported. These are, first, pre-bonding annealing at 600° C. or 800° C. in oxygen or argon to oxidize or to desorb thermally unstable $CH_x$ on the wafer surfaces and second bonding wafers with at least one wafer covered with an oxide layer to absorb the outgassing $CH_x$ in the open structures of the oxide as described by Mitani and co-workers. However, the high temperature annealing can not apply to bonding of silicon wafers containing temperature sensitive etch-stop layers or metallization or wafers other than silicon having low dissociation temperatures. Concerning the second approach, the enclosure of an oxide in the bonding structure is not always allowed and in addition, the high pressure of $CH_x$ in the oxide can still cause tiny bubbles to develop once one of the wafers in the bonded pair is thinned down to few micrometers or less.

Recently, ultraviolet/ozone cleaning which is not commonly available has been suggested by Takahagi, I. Nagai, A. Ishitani, H. Kuroda and Y. Nagasawa in 1988 in the Journal of Applied Physics, volume 64 starting from page 3516 to remove $CH_x$ from silicon surfaces at low temperatures. However, no results on preventing the thermal bubbles in bonded wafers cleaned by ultraviolet/ozone have been reported. It is highly desirable that a simple and low temperature method that is compatible with integrated circuits technology can be found to prevent thermal bubble generation in bonded silicon pairs.

The cause of thermal bubbles in hydrophilic silicon/silicon pairs have now been identified, and the principle of the bubble prevention methods is explained. Process procedures have been developed which use simple chemicals at low temperatures to remove thermally unstable $CH_x$ efficiently from hydrophilic silicon surfaces preventing bubble formation in bonded pairs of silicon wafers.

Up to now there has been a lack of direct evidence of what is inside the thermal bubbles. In order to identify the origins of thermal bubbles in bonded hydrophilic silicon/silicon pairs, 3", (100), CZ polished silicon wafers were cleaned by the most commonly used cleaning solution in present use termed RCA1 solution, which is composed of $NH_4OH$, $H_2O_2$, and $H_2O$ in the ratio of 1:1:5 by weight, and which is designed to remove the $CH_x$ from silicon surfaces by both the solvating action of the $NH_4OH$ and the oxidizing action of the $H_2O_2$ in the solution as has been reported by Kern and Duotinen in RCA Review, volume 31, beginning on page 186 in 1970. After this cleaning procedure the wafers were rinsed in deionized (DI) water followed by spin-drying and then annealed at 650° C. for 30 min in oxygen to completely remove thermally unstable $CH_x$ from the silicon surfaces. The wafers were immersed in DI water immediately after the annealing. The silicon wafers were hydrophilic and the room temperature bonding was spontaneous. An infrared (IR) imaging system was used for inspection for interface bubbles. Although there was molecular water at the bonding interface after room temperature bonding, thermal bubbles were not observed in these bonded pairs after annealing at any temperature. It implies that water does not form bubbles itself.

In contrast, there were many bubbles formed in the bonded pairs of RCA1 treated reference wafers after annealing at temperatures from 150° C. and up. It was found that if a Teflon wafer holder was used in RCA1 cleaning thermal bubbles begin to generate at 150° C. while if a quartz wafer holder was employed the bubble formation temperature increased to 300° C. Since $CH_x$ were not removed completely by RCA1 cleaning and $CH_x$ on hydrophilic silicon surface desorb quickly with temperature to vanish at ~250° C. in vacuum, it is likely that RCA1 can attack the Teflon holder (PFA, perfluoroalkoxy polytetrafluoroethylene) resulting in more residual $CH_x$ than that when a quartz holder is used.

When the RCA1-Teflon cleaned silicon wafers were immersed in nitric acid ($HNO_3$) at room temperature for 2 h or boiled in hydrogen peroxide ($H_2O_2$) for 20 min prior to bonding, no thermal bubbles were observed after 150° C. annealing even if a Teflon holder was used. There were also no thermal bubbles in RCA1-quartz cleaned silicon pairs after 150° C. annealing. It probably indicates that both nitric acid and hydrogen peroxide would attack the Teflon holder much less than RCA1 would do, and at the same time they can remove some of the $CH_x$ from the silicon surfaces. Although there are some terminating species other than Si—OH, Si—H and Si—$CH_x$ on the silicon surfaces after cleaning in different chemicals and DI water rinse, for instance, Si—$NH_2$ from RCA1, Si—$NO_3$ from $HNO_3$, etc., their dissociation seems to have no significant contribution to the thermal bubble formation at 150° C. However, in both cases of additional treatment, either immersion in nitric acid ($HNO_3$) at room temperature for 2 h or boiling in hydrogen peroxide ($H_2O_2$) for 20 min prior to bonding, interface bubbles nevetheless developed at temperatures higher than 300° C.

It has also been speculated that $CH_x$ is required for thermal bubble nucleation. From above discussion, it is clear that removal of themally unstable $CH_x$ from the bonding interface is the key to eliminate the thermal bubbles in bonded silicon wafer pairs.

A new wet chemical cleaning procedure (HI cleaning) has been developed to remove thermally unstable $CH_x$ from silicon surfaces. A quartz wafer holder must be employed in cleaning to avoid any possible organic contamination from a plastic wafer holder.

Preferred Embodiment of the Invention

The silicon wafers are first cleaned in RCA solution, either in RCA1 only or in RCA1 and RCA2 (HCl: $H_2O_2$:$H_2O$=1:1:5) as described by Kern and co-workers, both at ~80° C. for 10 min. Since standard RCA1 can cause microroughening of silicon surfaces which is detrimental for wafer bonding, it is recommended that a modified RCA1 solution ($NH_4OH$: $H_2O_2$:$H_2O$=0.25:1:5) may be adopted.

RCA1 is designed to remove $CH_x$ by both the solvating action of ammonium hydroxide and the strong oxidizing action of hydrogen peroxide. The chemistry of the cleaning is complicated by changes in the regent concentration with time and by complexing nature of the ammonium ions. Generally, the water-insoluble C═C hydrocarbons can be oxidized by $H_2O_2$ to di-alcohol which is more soluble in water:

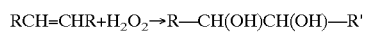

R and R' stand for regular alkyl group chains or branches. However, as mentioned before the stripping of hydrocarbons is not complete.

The second step of HI cleaning is to dip the RCA1 cleaned silicon wafers in boiling ~0.8% $H_5IO_6$ (or $HIO_4 \cdot 2H_2O$ periodic acid) aqueous solution for 15 min. The periodic acid is 99.999% pure solid. Periodic acid is an oxidizer much more powerful than hydrogen peroxide because the iodine in it is in highest possible valence state and is very susceptible to accept electrons from reaction partners. The typical reaction of periodic acid is probably to oxidize the di-alcohol to even smaller groups which dissolve in water readily resulting in efficient removal of almost all thermally unstable $CH_x$ from silicon surfaces:

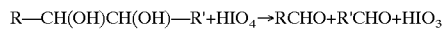

The main termination on silicon surface after HI cleaning followed by DI water rinse appears to be Si—OH, Si—H and in less amount Si—$IO_3$.

The exact concentration of $HIO_4$ is not critical and could be between 0.001 and 53.05 weight percent but the recommended concentration combined with the boiling time results in clean, smooth and hydrophilic silicon surfaces.

The HI cleaned silicon wafers were hydrophilic and bonded spontaneously. The bonded silicon pairs were annealed at temperatures from room temperature to 700° C. for 100 h at each temperature. No thermal bubbles could be observed by the IR imaging system for the bonded pairs after annealing at any temperature. Since the resolution of an IR imaging system to detect bubbles is usually limited to bubbles with a diameter of about 1 mm, a high resolution 100 MHz 3-dimensional acoustic microscope which is able to register bubbles of about 30 μm was employed to see whether smaller bubbles were present in the bonded pairs. The acoustic microscopic image of the interface of the bonded silicon/silicon pair after annealing showed no bubbles at the bonding interface of the pair.

A simple and low temperature chemical cleaning procedure (termed HI treatment) for silicon wafers has been developed which is compatible with main stream IC and wafer bonding processes. To prevent thermal bubbles from formation in bonded silicon wafer pairs, silicon wafers must be cleaned in boiling periodic acid aqueous solution following RCA treatment prior to bonding.

In a separate experiment it has been found that a couple of bubbles (2–6 mm in diameter) can be seen in HI treated silicon pairs after annealing at temperature range from 300° C. to 800° C. for a short time (0.3 h). The bubbles were shallow and disappeared after storage at room temperature in air for about 20 h. This behavior of bubbles is different from ordinary RCA teated silicon pairs in which bubbles do not change during room temperature storage. It is most likely that hydrogen is in the bubbles since hydrogen may be expected from thermal desorption of Si—$H_2$ or Si—H starting at about 300° C. and it diffuses quickly into silicon at room temperature.

The bonding strength of bonded silicon pairs was estimated by measuring the surface energy of one of the two wafers in a pair when a razor blade was inserted into the bonding interface. The annealing time was fixed at 100 h at any temperature to insure that the interface reached a stable state. The annealing time was fixed at 100 h at any temperature to insure that the interface reached a stable state. The surface energy of the HI treated silicon pairs increases from ~100 mJ/m$^2$ at room temperature to ~1200 mJ/m$^2$ at 150° C. The surface energy changes little from 150° C. to 600° C. and reaches that of bulk silicon at 700° C. as shown in FIG. 1 which is about 200° C. less than for RCA treated silicon pairs. The thin oxide about 50 Å thick is present at the bonding interface similar to that of normal RCA treated hydrophilic silicon pairs.

SIMS (Secondary Ion Mass Spectrometry) results show that compared to normal RCA treated silicon pairs there is a higher iodine concentration at the bonding interface of HI treated silicon pairs. Further investigation is required to clarify the influence of the residual iodine on the bonding system.

It is speculated that the efficient removal of thermally unstable hydrocarbons from silicon surfaces by the HI treatment is responsible for the absence of thermal bubbles in the bonded silicon pairs. The HI treated silicon pairs reach silicon fracture strength at as a low temperature as 700° C. More residual iodine is present at the interface, otherwise, the bonded HI treated silicon wafer pairs show a similar behavior as ordinary bonded RCA treated silicon wafer pairs.

Periodic acid aqueous solution is hazard-free and environmentally friendly. Although perchloric acid ($HClO_4$) may also be used to strip hydrocarbons due to the chemical similarity to periodic acid, it is much more difficult to handle and presents a severe explosion hazard. It is expected that the HI treatment may also find wide applications for cleaning surfaces of materials other than silicon and also for the cleaning and bonding of structured solids such as silicon wafers containing cavities as used for sensors and actuators in the area of micromechanics.

We claim:

1. An improved method for the direct bonding of two or more semiconductor wafers, each of which have at least one surface 13 wherein the improvement comprises a process for the provision of iodine on at least one said surface, said process consisting essentially of the steps of preparing a solution of periodic acid, heating said solution of periodic acid, exposing said surfaces to said solution of periodic acid, removing said surfaces from exposure to said solution of periodic acid, and drying said surfaces, whereby said surfaces are provided with iodine, said surfaces provided with iodine being bonded by direct bonding, without the formation of interface bubble after subsequent elevated temperature treatment of said bonded surfaces, whereby said direct bonding is improved.

2. An improved process for the direct bonding of semiconductor wafers having at least one surface as described in claim 1 wherein at least one of said solids is silicon.

3. An improved process for the direct bonding of semiconductor wafers having at least one surface as described in claim 1 wherein said solution of periodic acid contains between 0.001 and 53.05 weight percent of periodic acid in water.

4. An improved process for the direct bonding of semiconductor wafers as described in claim 3 wherein said solution of periodic acid is heated to between 25 degrees centigrade and 114 degrees centigrade.

5. An improved process for the direct bonding of semiconductor wafers having at least one surface as described in claim 1 wherein said semiconductor wafers are wafers of silicon.

6. An improved process for the direct bonding of semiconductor wafers having at least one surface as described in claim 1 wherein at least one of said semiconductor wafers is a structured solid.

7. An improved process for the direct bonding of semiconductor wafers as described in claim 6 wherein said structured solid is a structured silicon wafer.

* * * * *